United States Patent [19]

Takado et al.

[11] Patent Number: 5,421,954
[45] Date of Patent: Jun. 6, 1995

[54] PROCESS OF PATTERNING COMPOUND SEMICONDUCTOR FILM IN HALOGEN CONTAINING ETCHING GAS

[75] Inventors: Norikazu Takado; Shigeru Kohmoto, both of Tokyo, Japan

[73] Assignee: NEC Corporation, Tokyo, Japan

[21] Appl. No.: 990,192

[22] Filed: Dec. 14, 1992

[30] Foreign Application Priority Data

Dec. 20, 1991 [JP] Japan .................................. 3-355007

[51] Int. Cl.$^6$ ......................................... H01L 21/306
[52] U.S. Cl. .............................. 156/635.1; 437/133; 437/936
[58] Field of Search ................. 156/643, 662; 437/133, 437/936

[56] References Cited

U.S. PATENT DOCUMENTS

| | | | |
|---|---|---|---|
| 4,897,361 | 1/1990 | Harriott et al. | 437/936 |
| 4,933,299 | 6/1990 | Durose | 437/936 |
| 4,994,140 | 2/1991 | Kenzo et al. | 156/646 |
| 5,106,764 | 4/1992 | Harriott et al. | 437/936 |

OTHER PUBLICATIONS

N. Hamao, Y. Sugimoto, M. Sugimoto and H. Yokoyama, "Reduction in Interfacial Recombination Velocity Using in-situ Processing in AlGaAs/GaAs Overgrown Heterointerfaces", Opto-Electronics Research Laboratories, NEC Corporation, 2 pages, (published Sep. 28, 1992).

S. Miya et al., "Pattern Formation of GaAs Using InAs/GaAs Selective Etching by $Cl_2$ Gas", Proceedings for Fifth Section Meeting of Applied Physics Society, p. 1228, 11a-H-9 (published on Oct. 9, 1991).

B. P. Vander Gaag et al., "Microfabrication Below 10 Nanometers", SPIE Proc., Int. Soc. of Opt. Eng., vol. 1284, Mar. 20–21, 1990, pp. 161–169.

Primary Examiner—Brian E. Hearn
Assistant Examiner—Trung Dang
Attorney, Agent, or Firm—Burns, Doane, Swecker & Mathis

[57] ABSTRACT

A gallium arsenide film or an aluminum gallium arsenide film is patterned through a process sequence comprising the steps of: covering the gallium arsenide film with a mask layer of indium gallium phosphide, indium gallium arsenide or indium gallium arsenic phosphide, etching a part of the mask layer in a gaseous etchant containing chlorine gas under radiating an electron beam onto the part of the mask layer for forming an etching mask, and etching a part of the gallium arsenide in the gaseous etchant, wherein one of the composition and the thickness of the mask layer is regulated in such a manner that crystal defects due to lattice mis-match are restricted, thereby preventing the gallium arsenide film from undesirable large side etching.

16 Claims, 7 Drawing Sheets

PROCESS OF PATTERNING COMPOUND SEMICONDUCTOR FILM IN HALOGEN CONTAINING ETCHING GAS

FIELD OF THE INVENTION

This invention relates to a patterning technology and, more particularly, to an electron beam lithography combined with a dry etching carried out in halogen containing etching gas.

DESCRIPTION OF THE RELATED ART

Research and development efforts are made on compound semiconductor devices such as, for example, a high electron mobility transistor or a heterojunction bipolar transistor, and patterning technology is indispensable for fabrication processes of these compound semiconductor devices. One of the attractive patterning technologies is an electron beam lithography followed by a dry etching.

One of the dry etching techniques is disclosed by S. Miya et. al. in "Pattern Formation of GaAs using InAs/GaAs Selective Etching by $Cl_2$ Gas", Proceedings for Fifth-Second Meeting of Applied Physics Society, page 1228, 11a-H-9. The dry etching process combined with the electron beam lithography is hereinbelow described with reference to FIGS. 1A to 1C of the drawings.

First, an indium arsenide film 1 is deposited over a gallium arsenide film 2 to thickness of 50 nanometer for producing a multi-level structure, and an electron beam 3 at 20 kilo-volts is focused on the indium arsenide film 1 as shown in FIG. 1A. An irradiated area 1a is cross-linked, and becomes resistive against an etchant used in the next stage.

The multi-level structure is placed in a reactor 4 coupled with a chlorine gas source 5, and the multi-level structure is heated to 190 degrees in centigrade. Chlorine gas is introduced into the reactor 5 as the etchant, and the electron beam may be continuously radiated onto the area 1a. The chlorine gas attacks the non-irradiated area 1b of the indium arsenide, and the non-irradiated area 1b is removed from the multi-level structure. For this reason, only the irradiated area 1a is left on the gallium arsenide film 2, and the resultant structure of this stage is illustrated in FIG. 1B. The irradiated area 1a thus left on the gallium arsenide film 2 serves as an etching mask 1a for the gallium arsenide film 2.

Finally, using the irradiated area 1a as the etching mask 1a, the gallium arsenide film 2 is patterned. Namely, the multi-level structure is decreased in temperature to 130 degrees in centigrade, and chlorine gas pressure is regulated to $3.5 \times 10^{-4}$ torr. The gallium arsenide film 2 is exposed to the chlorine gas for 60 minutes, and the chlorine gas removes the gallium arsenide exposed thereto. As a result, the gallium arsenide film 2 is patterned, and an area 2a overlain by the etching mask 1a projects from the remaining area 2b by 2.7 microns.

A problem is encountered in the prior art patterning process in large side etching due to the chlorine gas, and the prior art patterning technology is not appropriate for a miniature pattern.

Another problem inherent in the prior art patterning technology relates to the etching mask 1a left on the gallium arsenide film 2. Since the indium arsenide is different in lattice constant from the gallium arsenide, crystal defects take place in the indium arsenide film 1 of 50 nanometer and, accordingly, the etching mask 1a due to lattice mismatch. In order to further grow compound semiconductor films through a vacuum process, it is necessary to remove the etching mask 1a. However, there is not any suitable etchant with large etch rate between indium arsenide and gallium arsenide, and the etching mask 1a is hardly removed from the gallium arsenide film 2. For this reason, the prior art patterning process is hardly combined with the vacuum growing process.

SUMMARY OF THE INVENTION

It is therefore an important object of the present invention to provide a patterning process which is suitable for a miniature pattern as well as combinable with a vacuum growing process.

To accomplish the object, the present invention proposes to regulate the composition and/or the thickness of a compound semiconductor film of an etching mask for restricting crystal defects.

In accordance with the present invention, there is provided a process of patterning a compound semiconductor film comprising the steps of: a) covering an objective film of first compound semiconductor selected from the group consisting of gallium arsenide and aluminum gallium arsenide with a mask layer of second compound semiconductor selected from the group consisting of indium gallium phosphide, indium gallium arsenide and indium gallium arsenic phosphide for fabricating a multi-level structure, at least one of the composition and the thickness of the second compound semiconductor being regulated in such a manner that crystal defects due to lattice mis-match between the first compound semiconductor and the second compound semiconductor are decreased; b) etching a part of the mask layer in a gaseous etchant containing halogen gas under radiating an electron beam onto the part of the mask layer for forming an etching mask exposing a part of the objective film under the part of the mask layer; and c) etching the part of the objective film in said gaseous etchant containing the halogen gas for patterning the objective film.

The halogen gas may be chlorine, and the objective film may be etched under radiation of an electron shower fallen onto the entire surface. Moreover, the mask layer may be overlain by a protective film for preventing the mask layer from oxygen attack.

BRIEF DESCRIPTION OF THE DRAWINGS

The features and advantages of the patterning process according to the present invention will be more clearly understood from the following description taken in conjunction with the accompanying drawings in which.

DESCRIPTION OF THE PREFERRED EMBODIMENTS

First Embodiment

Figure 1A:
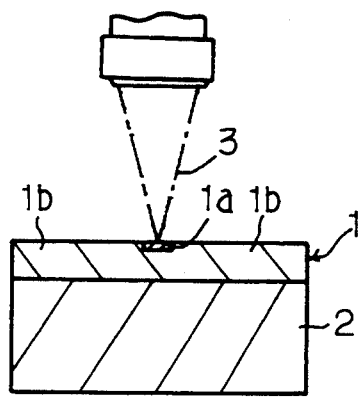
FIGS. 1A to 1C are cross sectional views showing the prior art patterning process sequence.
Figure 1B:
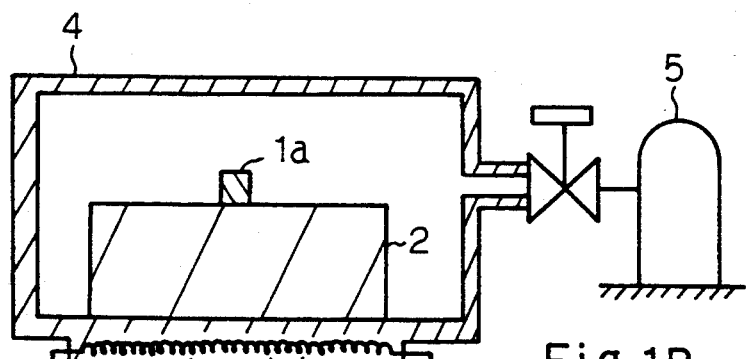
Figure 1C:
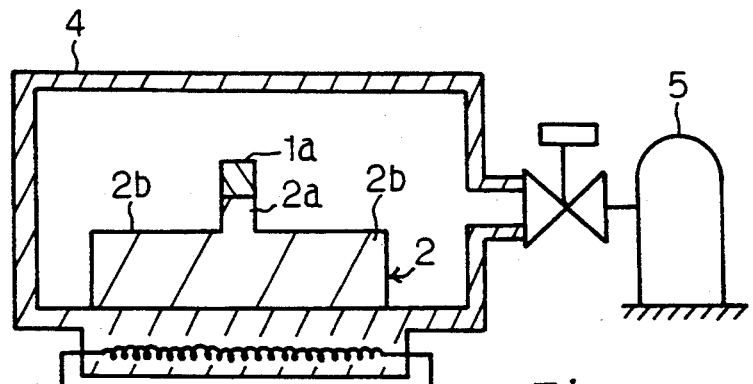
Figure 2A:
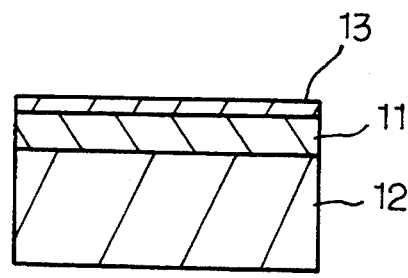
FIGS. 2A to 2C are cross sectional views showing a process sequence of patterning a compound semiconductor film according to the present invention.

Referring to FIG. 2A of the drawings, a patterning process embodying the present invention starts with preparation of an objective film 11 of gallium arsenide grown on a substrate 12 of gallium arsenide to thickness of 1 micron. A mask layer 13 of indium gallium phosphide is grown on the objective film 11 to thickness of 20 nanometer through a molecular beam epitaxy using gas sources as shown in FIG. 2A, and the indium content of the indium gallium phosphide is regulated to 0.48 so as to be expressed as $In_{0.48}Ga_{0.52}P$. The indium gallium phosphide thus regulated is lattice matched with the gallium arsenide, and crystal defects are effectively decreased regardless of the thickness of the mask layer 13.

Figure 2B:
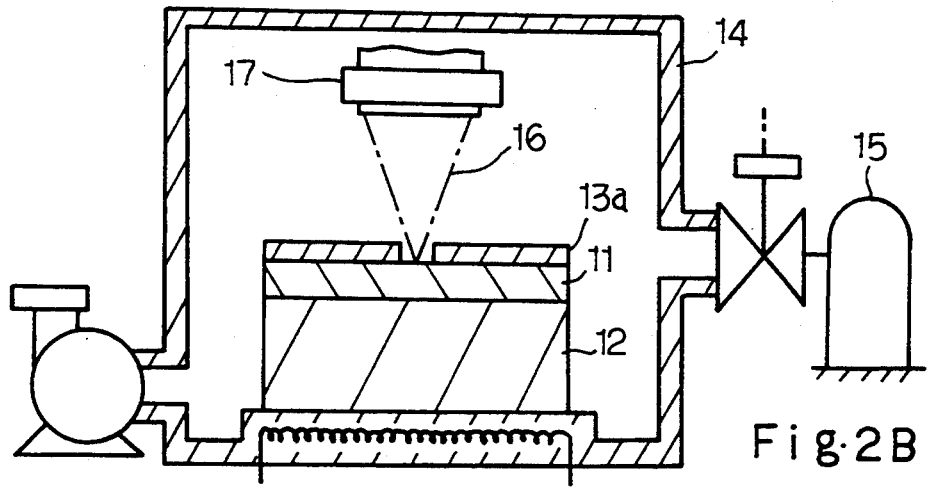

Subsequently, the multi-level structure shown in FIG. 2A is placed in an etching reactor 14, and is heated to 160 degrees in centigrade. Etching gas is introduced from a gas source 15, and the etching gas contains halogen such as chlorine. In this instance, the partial pressure of chlorine is regulated to $5\times10^{-5}$ torr, and the chlorine gas is, by way of example, carried by argon. Electron beam 16 is radiated from an electron gun 17 under acceleration energy at 3 kilo-volts, and is focused on a predetermined portion of the mask layer 13. In these circumstances, electron beam assisted gas etching is carried out for 5 minutes. As a result, the irradiated portion of the mask layer 13 is selectively removed from the multi-level structure, and the objective film 11 is partially exposed. However, the nonirradiated portion 13a of the mask layer 13 is left on the objective film 11, and the nonirradiated portion 13a serves as an etching mask as shown in FIG. 2B.

Figure 2C:
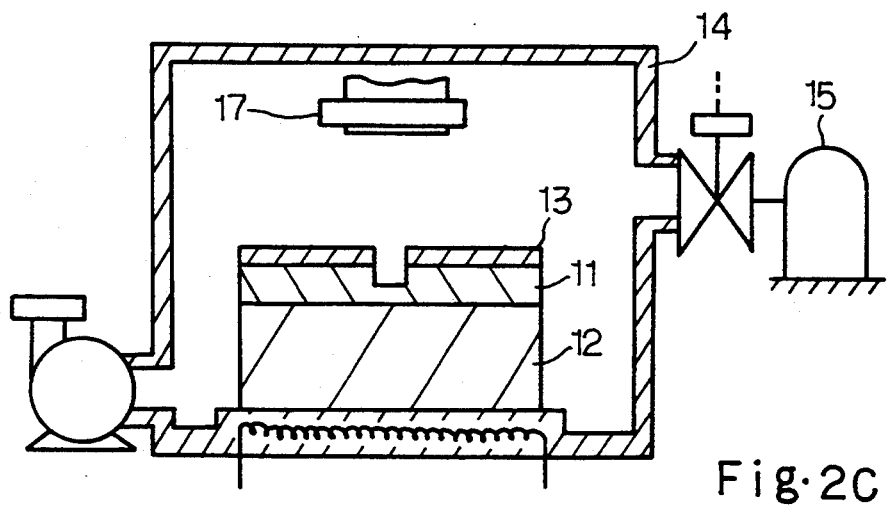

Subsequently, the temperature of the substrate 12 is decreased to 100 degrees in centigrade, and the partial pressure of chlorine is maintained at $5\times^{-5}$ torr. The gas etching is carried out for 30 minutes without any electron-beam assist, and the etching gas attacks the gallium arsenide through the etching mask 13a. The objective film 11 is partially removed as shown in FIG. 2C, and the process sequence according to the present invention is available for patterning the gallium arsenide film 11.

As described hereinbefore, the composition of the indium gallium phosphide is regulated in such a manner as to be lattice matched with the gallium arsenide, and, accordingly, crystal defects are decreased. For this reason, the etching speed are not accelerated by the crystal defects, and the gas etching is well controlled. This results in that the over-etching hardly takes place, and the aspect ratio is fallen within a design range. The small amount of crystal defect allows a semiconductor manufacturer to carry out further crystal growth, and the patterning process according to the present invention can be combined with a growing process.

In this instance, the patterned objective film 11 is formed of gallium arsenide. However, the process sequence according to the present invention is available for an aluminum gallium arsenide film. If the mask layer 13 of indium gallium phosphide is grown over the critical thickness of the lattice mis-match therebetween, the composition of indium gallium phosphide should be changed in such a manner that the indium gallium phosphide is lattice matched with the aluminum gallium arsenide for restricting crystal defects. For example, if the patterned aluminum gallium arsenide is expressed as $Al_xGa_{1-x}As$, the composition of indium gallium phosphide should be adjusted to $In_{0.48Ga}Ga_{0.52}P$ for lattice matching.

Moreover, if the crystal defects are effectively decreased, the problems inherent in the prior art process are solved, and, for this reason, the thickness less than the critical thickness allows the mask layer 13 to be lattice mis-matched with the patterned objective film 11. For example, if the patterned objective film 11 is formed of gallium arsenide, the critical thickness of the mask layer 13 of $In_{0.2}Ga_{0.8}As$ is of the order of 3.5 nanometer. Of course, the critical thickness is varied with the composition of indium gallium arsenide. Similarly, if the patterned objective film 11 is formed of aluminum gallium arsenide expressed as $Al_xGa_{1-x}As$, the critical thickness for $In_{0.2}Ga_{0.8}As$ is also about 3.5 nanometer.

Second Embodiment

Figure 3A:
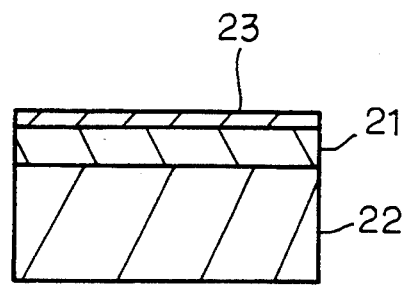
FIGS. 3A to 3C are cross sectional views showing another process sequence of a patterning a compound semiconductor film according to the present invention.
Figure 3B:
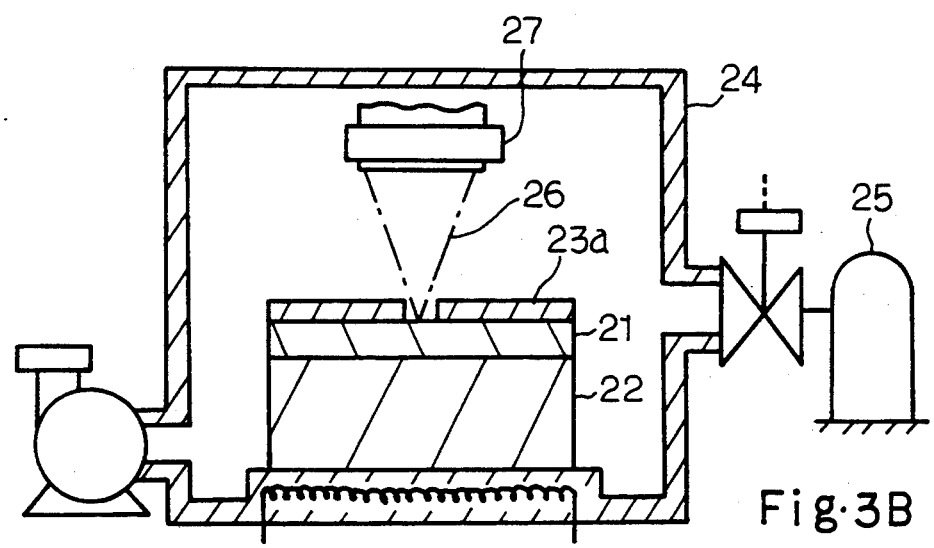
Figure 3C:
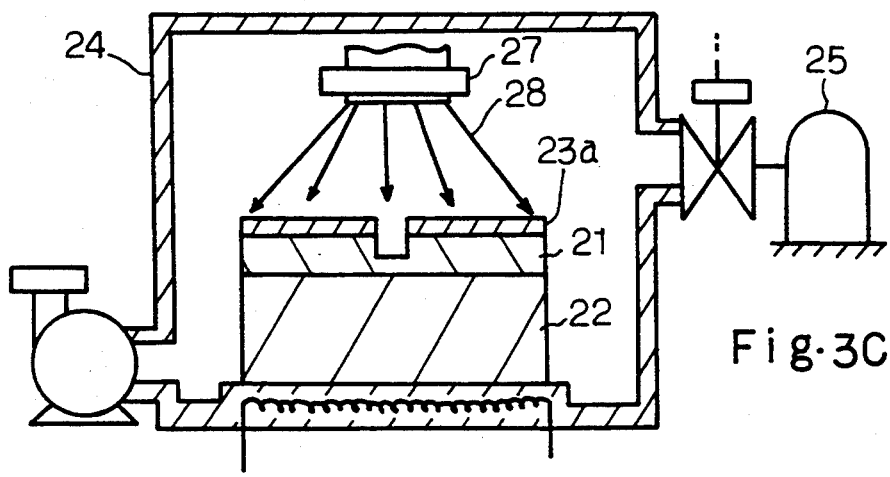

FIGS. 3A to 3C illustrate another process sequence for patterning a compound semiconductor film according to the present invention. The process sequence implementing the second embodiment starts with preparation of an objective film 21 of gallium arsenide film grown on a semi-insulating substrate 22 of gallium arsenide to thickness of 1 micron. A mask layer 23 of indium gallium phosphide is grown on the objective film 21 to thickness of 20 nanometer through a molecular beam epitaxy using gas sources as shown in FIG. 3A, and the indium content of the indium gallium phosphide is regulated to 0.48 so as to be expressed as $In_{0.48}Ga_{0.52}P$. The indium gallium phosphide thus regulated is lattice matched with the gallium arsenide, and crystal defects are effectively decreased regardless of the thickness of the mask layer 23.

Subsequently, the multi-level structure shown in FIG. 3A is placed in a reactor 2, and is heated to 160 degrees in centigrade. Etching gas is introduced from a gas source 25 and the etching gas contains halogen such as chlorine. In this instance, the partial pressure of chlorine gas is regulated to $5\times10^{-5}$ torr. Electron beam 26 is radiated from an electron gun 27 under acceleration energy at 3 kilo-volts, and is focused on a predetermined portion of the mask layer 23. In theses circumstances, electron beam assisted gas etching is carried out for 5 minutes. As a result, the irradiated portion of the mask layer 23 is selectively removed from the multi-level structure as shown in FIG. 3B, and the objective film 21 is partially exposed. However, the nonirradiated portion 23a of the mask layer 23 is left on the objective film 21, and the nonirradiated portion 23a serves as an etching mask. Since electron is ten thousand times lighter than ion, the electron bombardment hardly damages the exposed portion of the objective film 21.

Subsequently, the temperature of the substrate 22 is decreased to 50 degrees in centigrade, and the partial pressure of chlorine is maintained at $5\times^{-5}$ torr. The electron gun 27 radiates an electron shower 28 onto the entire surface of the structure at acceleration energy of 500 volts, and gas etching is carried out for 30 minutes. The etching gas attacks the gallium arsenide through the etching mask 23a. The objective film 21 is partially removed as shown in FIG. 3C, and the process sequence according to the present invention is available for patterning the compound semiconductor film 21.

As described hereinbefore, the composition of the indium gallium phosphide is regulated in such a manner as to be lattice matched with the gallium arsenide, and, accordingly, crystal defects are effectively decreased. For this reason, the etching speed are not accelerated by the crystal defects, and the gas etching is well controlled. This results in that the over-etching hardly takes place, and the aspect ratio is fallen within a design range. The small amount of crystal defect allows a semiconductor manufacturer to further carry out a crystal growth on the etching mask 23a, and the patterning process according to the present invention can be combined with a growing process.

The mask layer may be formed of indium gallium arsenic phosphide $In_xGa_{1-x}As_yP_{1-y}$, and the composition is regulated to $In_{0.48}Ga_{0.52}As_yP_{1-y}$. The indium gallium arsenic phosphide thus regulated is available in the second process sequence instead of the indium gallium phosphide, and the indium gallium arsenic phosphide is lattice latched with the gallium arsenide.

Moreover, indium gallium arsenide is further available for the mask layer. If the indium gallium arsenide is expressed as $In_{0.2}Ga_{0.8}As$, the indium gallium arsenide is lattice mis-matched with the gallium arsenide, and the mask layer is regulated under the critical thickness of 3.5 nano-meter.

If the substance of a mask layer 23 is lattice mismatched with the substance of an objective film 21, thickness of the mask layer 23 is decreased to predetermined thickness not greater than the critical thickness.

Third Embodiment

Figure 4A:
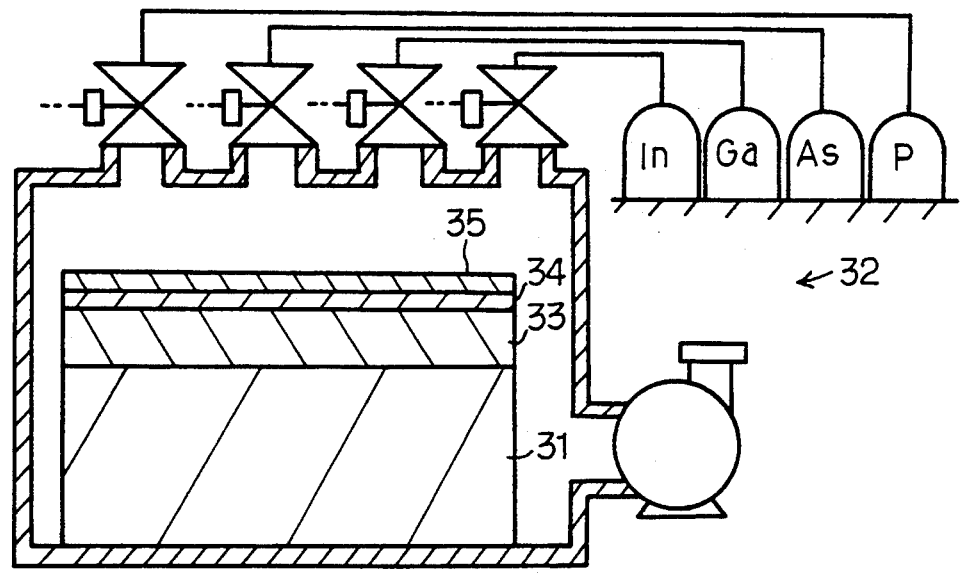
FIGS. 4A to 4D are cross sectional views showing yet another process sequence of a patterning a compound semiconductor film according to the present invention.

FIGS. 4A to 4D illustrate yet another process sequence embodying the present invention. The process sequence starts with preparation of a semi-insulating substrate 31 of gallium arsenide, and the semi-insulating substrate 31 is placed in a gas-source molecular-beam epitaxial system 32. An objective film 33 of gallium arsenide is grown on the major surface of the semi-insulating substrate 31 to thickness of 1 micron, and a mask layer 34 of indium gallium arsenic phosphide is in turn grown on the objective film 33 to thickness of 20 nanometer. In this instance, the indium gallium arsenic phosphide is expressed as $In_{0.2}Ga_{0.8}As_{0.5}P_{0.5}$. The indium gallium arsenic phosphide is lattice matched with the gallium arsenide, and crystal defects are effectively decreased regardless of the thickness of the mask layer 34. A protective film 35 of gallium arsenide is grown on the mask layer 34 to thickness of 5 nanometer, and a multi-level structure is fabricated as shown in FIG. 4A.

The multi-level structure is taken out from the gas-source molecular-beam epitaxial system 32, and is conveyed to an etching reactor 36. While an operator is conveying the multi-level structure from the gas-source molecular-beam epitaxial system 32 to the etching reactor 36, the multi-level structure is unintentionally exposed to the air, and undesirable natural oxide covers the surface of the multi-level structure.

Figure 4B:
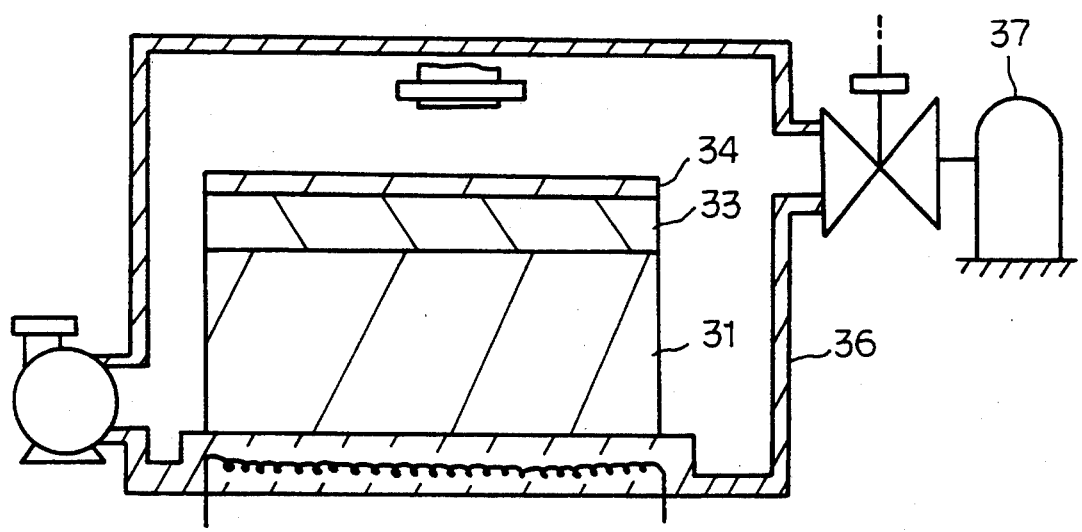

In the etching reactor, the semi-insulating substrate 31 is heated to 160 degrees in centigrade, and gaseous etchant is introduced from a gas source 37. The gaseous etchant contains chlorine, and the partial pressure of chlorine is regulated to $5 \times 10^{-5}$ torr. Then, the protective film 35 is removed together with the natural oxide, and the mask layer 34 is exposed as shown in FIG. 4B.

Figure 4C:
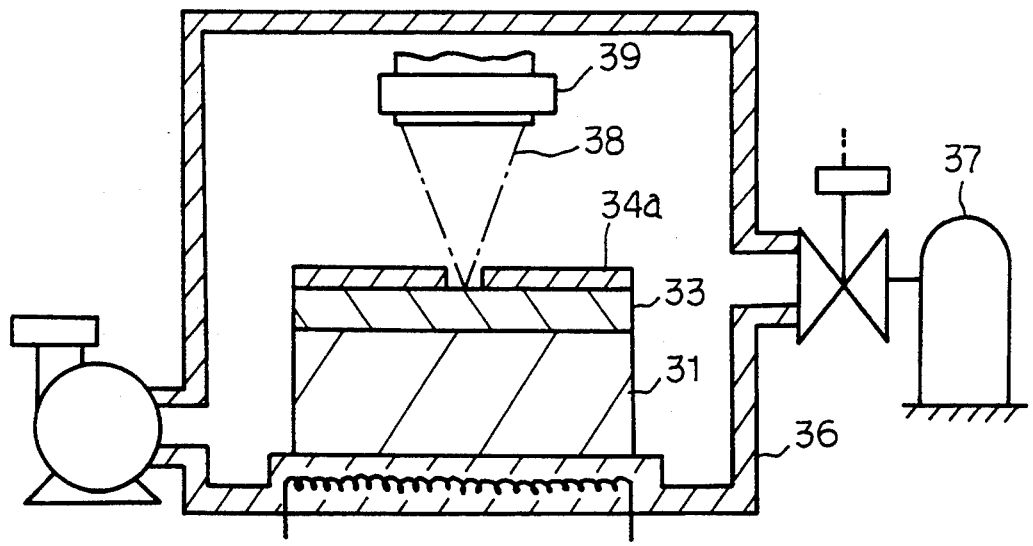

The semi-insulating substrate 31 is maintained at 160 degrees in centigrade, and the etching gas is introduced from the gas source 37, and the partial pressure of chlorine is also maintained at $5 \times 10^{-5}$ torr. Electron beam 38 is radiated from an electron gun 39 under acceleration energy at 3 kilo-volts, and is focused on a predetermined portion of the mask layer 34. In these circumstances, electron beam assisted gas etching is carried out for 5 minutes. As a result, the irradiated portion of the mask layer 34 is selectively removed from the multi-level structure, and the objective film 33 is partially exposed. However, the nonirradiated portion 34a of the mask layer 34 is left on the objective film 33 as shown in FIG. 4C, and the nonirradiated portion 34a serves as an etching mask.

Figure 4D:
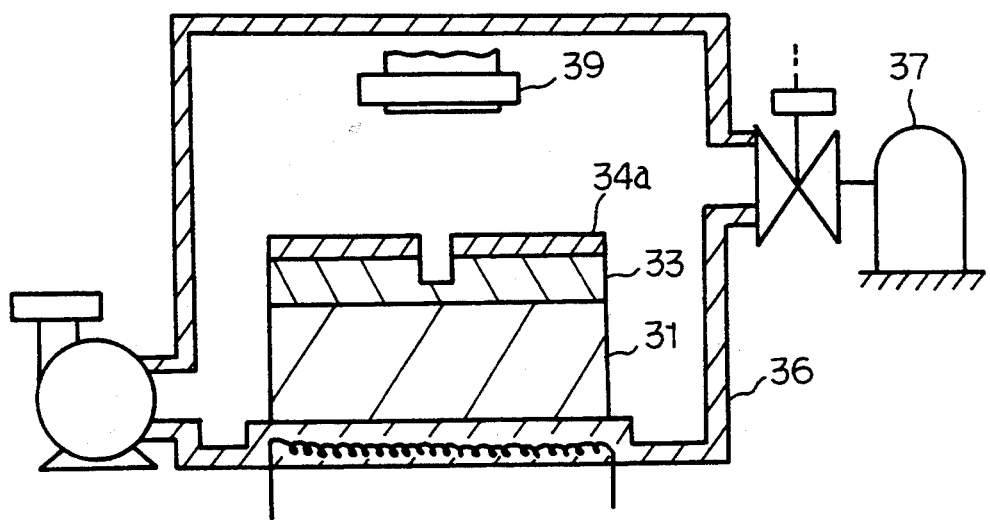

Subsequently, the temperature of the semi-insulating substrate 31 is decreased to 100 degrees in centigrade, and the partial pressure of chlorine is maintained at $5 \times^{-5}$ torr. The gas etching is carried out for 30 minutes without any electron beam assist, and the etching gas attacks the gallium arsenide through the etching mask 34a. The objective film 33 is partially removed as shown in FIG. 4D, and the process sequence according to the present invention is available for patterning the gallium arsenide film.

The process sequence implementing the third embodiment achieves the goals as the first embodiment, and the protective film 35 allows the multi-level structure to be exposed to the air. In detail, if no protective film covers the mask layer of indium gallium phosphide, the indium gallium phosphide is oxidized in the air, and the natural oxide deteriorates the reproducibility of the gas etching, because the chlorine gas can not remove the natural oxide of the indium gallium phosphide film. Another reason for the poor reproducibility is the electron bombardment. Since electron is ten thousand times lighter than ion, the electron bombardment can not be expected to remove the natural oxide. In order to prevent the indium gallium phosphide from oxidation, the gas-source molecular beam epitaxial system 32 should be conducted with the etching reactor in vacuum, and the multi-level structure is conveyed in vacuum. However, such a combined system is extremely complex, and is dangerous because of phosphine ($PH_3$) used in the gas-source molecular beam epitaxial system 32.

Another approach against the natural oxide is cleaning in an arsenic atmosphere ($As_4$) at high temperature. However, the arsenic atoms tend to replace the phosphorous atoms, and the indium gallium phosphide is liable to be converted into indium gallium arsenide. As described hereinbefore, the indium gallium arsenide is lattice mis-matched with the gallium arsenide, and a large amount of crystal defects take place. Moreover, the indium gallium arsenide film does not allow the arsenic atmosphere to further remove the natural oxide, and the cleaning in the arsenic atmosphere is not feasible. However, the protection film 35 prevents the mask layer 34 from oxidation, and the natural oxide of gallium arsenide is removed with the chlorine containing etching gas. For this reason, the protection film 35 is desirable solution, and enhances the operability in the patterning process.

Fourth Embodiment

Figure 5A:
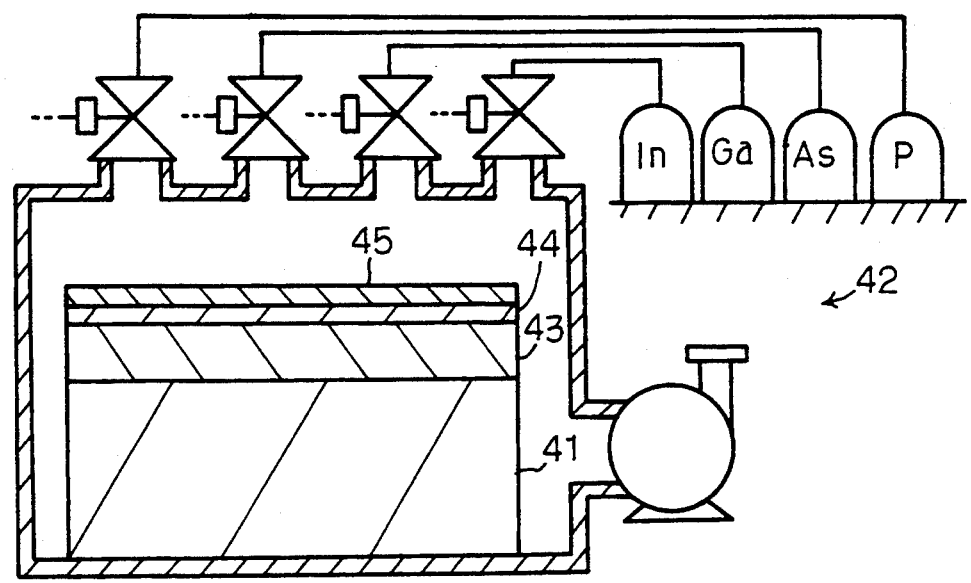
FIGS. 5A to 5D are cross sectional views showing still another process sequence of a patterning a com-

FIGS. 5A to 5D illustrate still another process sequence embodying the present invention. The process sequence starts with preparation of a semi-insulating substrate 41 of gallium arsenide, and the semi-insulating substrate 41 is placed in a gas-source molecular-beam epitaxial system 42. An objective film 43 of gallium arsenide is grown on the major surface of the semi-insulating substrate 41 to thickness of 1 micron, and a mask layer 44 of indium gallium arsenic phosphide is in turn grown on the objective film 43 to thickness of 20 nanometer. In this instance, the indium gallium arsenic phosphide is regulated to the composition expressed as $In_{0.2}Ga_{0.8}As_{0.5}P_{0.5}$. For this reason, the indium gallium arsenic phosphide is lattice matched with the gallium arsenide, and crystal defects are effectively decreased regardless of the thickness of the mask layer 54. A protective film 45 of gallium arsenide is grown on the mask layer 44 to thickness of 5 nanometer, and a multi-level structure is fabricated as shown in FIG. 5A.

The multi-level structure is taken out from the gas-source molecular-beam epitaxial system 42, and is conveyed to an etching reactor 46. While an operator is conveying the multi-level structure from the gas-source molecular-beam epitaxial system 42 to the etching reactor 46, the multi-level structure is unintentionally exposed to the air, and undesirable natural oxide covers the surface of the multi-level structure.

Figure 5B:
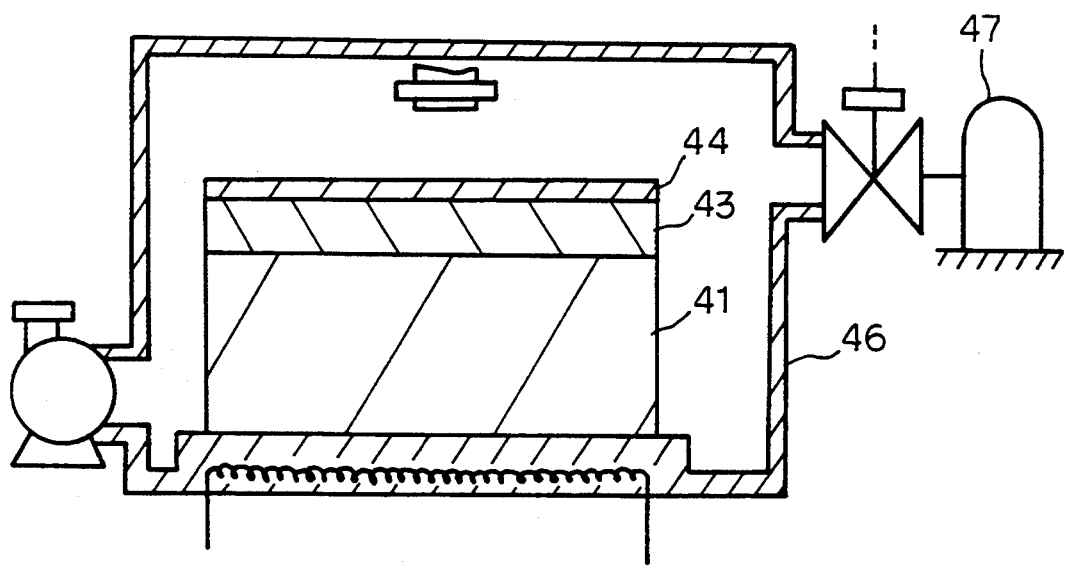

In the etching reactor 46, the semi-insulating substrate 41 is heated to 160 degrees in centigrade, and gaseous etchant is introduced from a gas source 47. The gaseous etchant contains chlorine, and the partial pressure of chlorine is regulated to $5 \times 10^{-5}$ torr. Then, the protective film 45 is removed together with the natural oxide, and the mask layer 44 is exposed as shown in FIG. 5B.

Figure 5C:
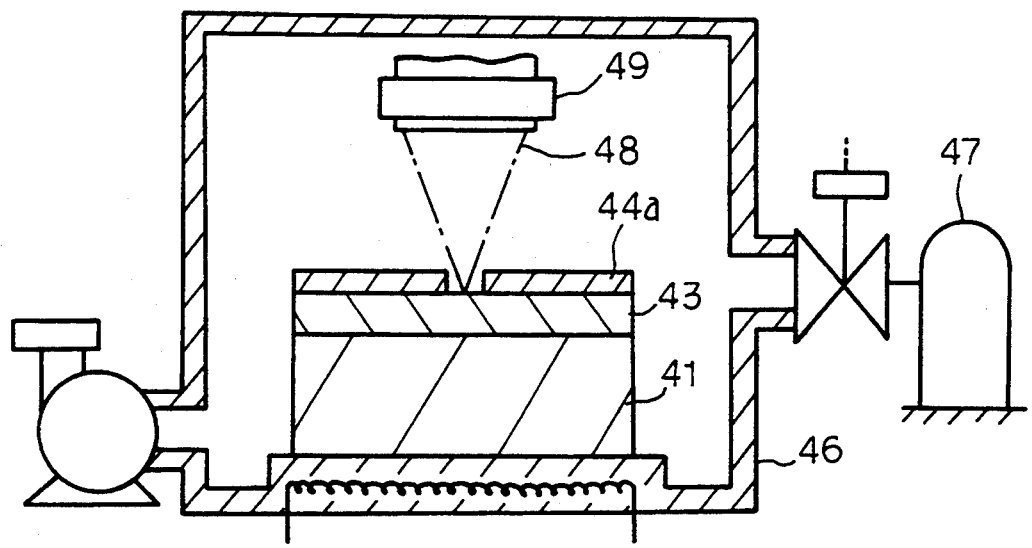

The semi-insulating substrate 41 is maintained at 160 degrees in centigrade, and the etching gas is continuously introduced from the gas source 37, and the partial pressure of chlorine is also maintained at $5 \times 10^{-5}$ torr. Electron beam 48 is radiated from an electron gun 49 under acceleration energy at 3 kilo-volts, and is focused on a predetermined portion of the mask layer 44. In these circumstances, electron beam assisted gas etching is carried out for 5 minutes. As a result, the irradiated portion of the mask layer 44 is selectively removed from the multi-level structure, and the objective film 43 is partially exposed. However, the nonirradiated portion 44a of the mask layer 44 is left on the objective film 43 as shown in FIG. 5C, and the nonirradiated portion 44a serves as an etching mask.

Figure 5D:
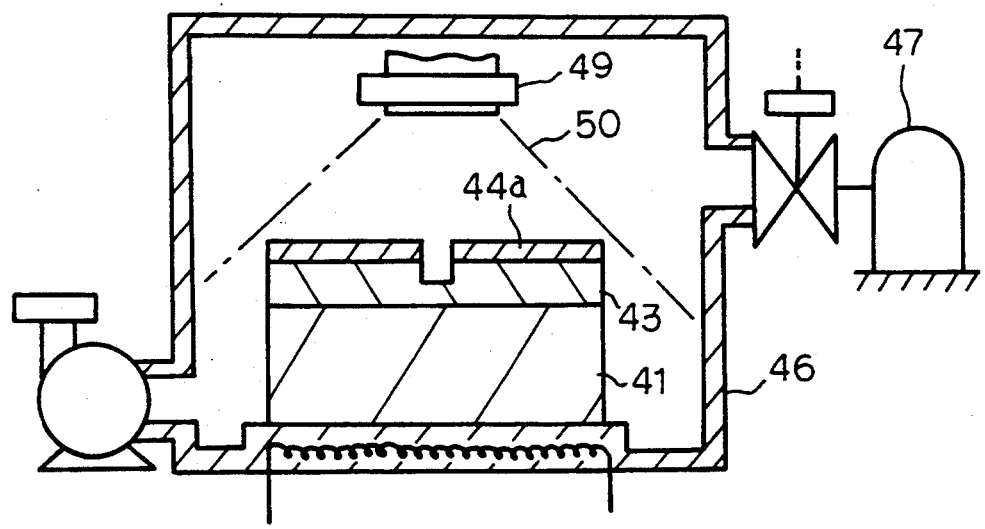

Subsequently, the temperature of the semi-insulating substrate 41 is decreased to 50 degrees in centigrade, and the partial pressure of chlorine is maintained at $5 \times^{-5}$ torr. The electron gun 49 radiates electron shower 50 onto the entire surface of the structure at 500 volts, and the gas etching is carried out for 30 minutes. The etching gas attacks the gallium arsenide through the etching mask 34a, and the objective film 43 is partially removed as shown in FIG. 5D. However, the gallium arsenide covered with the mask layer 44a is left on the semi-insulating substrate 41, and the process sequence according to the present invention is available for patterning the gallium arsenide film.

Although not repeated, the process sequence implementing the third embodiment achieves the goals as the first embodiment, and the protective film 45 allows the multi-level structure to be exposed to the air.

Although particular embodiments of the present invention have been shown and described, it will be obvious to those skilled in the art that various changes and modifications may be made without departing from the spirit and scope of the present invention. For example, compound semiconductor films may be grown through another epitaxial process, and various combinations of thickness and composition may be tried. Moreover, the chlorine gas may be carried by nitrogen gas.

What is claimed is:

1. A process of patterning a compound semiconductor film comprising the steps of:
  a) covering an objective film of a first compound semiconductor selected from the group consisting of gallium arsenide and aluminum gallium arsenide with a mask layer of a second compound semiconductor selected from the group consisting of indium gallium phosphide, indium gallium arsenide and indium gallium arsenic phosphide to produce a multi-level structure, said second compound semiconductor having a composition lattice matched with said first compound semiconductor or said second compound semiconductor having a thickness less than a critical thickness for crystal defects;
  b) etching a part of said mask layer in a gaseous etchant containing halogen gas under radiating an electron beam onto said part of said mask layer for forming an etching mask exposing a part of said objective film under said part of said mask layer; and
  c) etching said part of said objective film in said gaseous etchant containing said halogen gas for patterning said objective film.

2. A process as set forth in claim 1, in which said halogen gas is chlorine gas.

3. A process as set forth in claim 2, in which said step b) is carried out under conditions where said multi-level structure is heated to 160 degrees in centigrade, the chlorine gas in said gaseous etchant is regulated to $5 \times 10^{-5}$ torr and said electron beam is radiated under acceleration energy at 3 kilo-volts.

4. A process as set forth in claim 3, in which said step c) is carried out under conditions where said multi-level structure is heated at 100 degrees in centigrade and said chlorine gas of said gaseous etchant is regulated to $5 \times 10^{-5}$ torr, and no electron beam is radiated.

5. A process as set forth in claim 1, in which the composition of said mask layer formed of indium gallium phosphide is regulated to $In_{0.48}Ga_{0.52}P$ so that said indium gallium phosphide is lattice matched with said objective layer of gallium arsenide.

6. A process as set forth in claim 2, in which said objective film is etched by said chlorine gas under radiation of electron shower onto the entire surface of the multi-level structure in said step c).

7. A process as set forth in claim 6, in which said step b) is carried out under conditions where said multi-level structure is heated to 160 degrees in centigrade, said chlorine gas in said gaseous etchant is regulated to $5 \times 10^{-5}$ torr and said electron beam is radiated under acceleration energy at 3 kilo-volts, and in which said step c) is carried out under conditions where said multi-level structure is heated at 50 degrees in centigrade, said chlorine gas of said gaseous etchant is regulated to $5 \times 10^{-5}$ torr, and said electron shower is radiated at 500 volts.

8. A process as set forth in claim 1, in which the composition of said mask layer formed of indium gallium phosphide is regulated to $In_{0.48}Ga_{0.52}P$ so that said indium gallium phosphide is lattice matched with said objective layer of gallium arsenide regardless of thickness thereof.

9. A process as set forth in claim 2, in which the composition of said mask layer formed of indium gallium arsenic phosphide is expressed as $In_{0.48}Ga_{0.}$-

$_{52}As_{0.5}P_{0.5}$ so that said indium gallium arsenic phosphide is lattice matched with said objective film of gallium arsenide regardless of the thickness thereof.

10. A process as set forth in claim 2, in which the composition of said mask layer formed of indium gallium arsenide is expressed as $In_{0.2}Ga_{0.8}As$, and the thickness of the indium gallium arsenide is not greater than the critical thickness of 3.5 nanometers so that crystal defects are decreased under lattice mis-match between the indium gallium arsenide and the objective film of gallium arsenide.

11. A process of patterning a compound semiconductor film further comprising the step of covering said mask layer with a protective film of a third compound semiconductor between said step a) and said step b), natural oxide of said third compound semiconductor being able to be removed in said gaseous etchant without any electron beam radiation.

12. A process as set forth in claim 11, in which said natural oxide is removed in said gaseous etchant without any electron beam radiation ]prior to said etching on said mask layer in said step b).

13. A process as set forth in claim 12, in which said third compound semiconductor is gallium arsenide.

14. A process as set forth in claim 13, in which said natural oxide is in said gaseous etchant containing chlorine at 160 degrees in centigrade, said multilevel structure being heated to 160 degrees in centigrade.

15. A process of patterning a compound semiconductor film comprising the steps of:
   a) covering an objective film of a first compound semiconductor selected from the group consisting of gallium arsenide and aluminum gallium arsenide with a mask layer of a second compound semiconductor selected from the group consisting of indium gallium phosphide, indium gallium arsenide and indium gallium arsenic phosphide to produce a multi-level structure, said second compound semiconductor having a composition lattice matched with said first compound semiconductor or said second compound semiconductor having a thickness less than a critical thickness for crystal defects;
   b) etching a part of said mask layer in a gaseous etchant containing halogen gas under radiating an electron beam onto said part of said mask layer for forming an etching mask exposing a part of said objective film under said part of said mask layer; and
   c) etching said part of said objective film in said gaseous etchant containing said halogen gas for patterning said objective film under electron flood.

16. The process as set forth in claim 1, wherein said second compound semiconductor is protected from being exposed to oxygen by forming a protecting film thereon.

* * * * *